United States Patent [19]

Murray et al.

[11] Patent Number: 5,784,378
[45] Date of Patent: Jul. 21, 1998

[54] METHOD AND APPARATUS FOR TIME SHAPED FINITE IMPULSE RESPONSE FILTER WITH MULTIPLE SIGNAL STREAM CAPABILITY

[75] Inventors: Brian P. Murray; Philip A. Curran, both of Dublin, Ireland; Colm J. Prendergast, Cambridge, Mass.; Timothy J. Cummins, County Clare, Ireland

[73] Assignee: Analog Devices, Inc., Norwood, Mass.

[21] Appl. No.: 655,769

[22] Filed: May 30, 1996

[51] Int. Cl.[6] ............................... H04J 1/10
[52] U.S. Cl. ........................... 370/498; 370/497
[58] Field of Search .................. 370/498, 532, 370/533, 534, 535, 536, 537, 539, 541, 542, 366, 497, 409, 509, 517, 510, 519

[56] References Cited

U.S. PATENT DOCUMENTS

| | | | |
|---|---|---|---|
| 5,113,362 | 5/1992 | Harston et al. | 364/723 |
| 5,121,207 | 6/1992 | Hermann | 358/160 |
| 5,313,205 | 5/1994 | Wilson | 341/144 |
| 5,398,240 | 3/1995 | Nakashima et al. | 370/498 |
| 5,475,684 | 12/1995 | Shimizu | 370/498 |

OTHER PUBLICATIONS

Andre Abrial, et al. "A 27-MHz Digita-to-Analog Video Processor", IEEE Journal of Solid-State Circuits, vol. 23, No. 6, Dec. 1988.

*Primary Examiner*—Dang Ton
*Attorney, Agent, or Firm*—Fish & Richardson P.C.

[57] ABSTRACT

A novel finite impulse response filter apparatus and method. A multiplexed data stream composed of two or more data streams is provided as an input to a tapped delay line. Weight and sum operators are connected to the even or odd delay line taps and generate a filtered output. The filter operates on one data stream per cycle and generates a multiplexed output. In another form, odd weight and sum operates are connected to and odd taps generating two filtered outputs. The filter operates on both data streams in each cycle and generates two multiplexed outputs. A crossbar switch is disclosed for parsing the multiplexed outputs into the constituent filtered data streams. The filter stages may be cascaded.

20 Claims, 3 Drawing Sheets

METHOD AND APPARATUS FOR TIME SHAPED FINITE IMPULSE RESPONSE FILTER WITH MULTIPLE SIGNAL STREAM CAPABILITY

BACKGROUND OF THE INVENTION

The invention relates generally to the field of finite impulse response filters and more specifically to digital sample interpolators for use in digital-to-analog video encoders.

In the television environment, there are many different standards for representing color information which are commonly referred to as color spaces. Color Spaces generally differ from each other in several respects including the signal magnitudes, frequency spectrum characteristics, and sampling frequencies (for digital color spaces).

Typically, conversion from one color space to another involves simple equation solving and filtering. In some cases however the sample rates need to be changed. For example, converting 4:2:2 YCrCb Color Space data as defined by CCIR-601 to YUV data which is used to form a composite TV signal requires sample rate conversion. The 4:2:2 term refers to a difference in the sample rates between Y (13.5 MHz) and the Cr/Cb (both sampled at 6.75 MHz). In order to maintain signal integrity, the conversion process requires interpolation of the individual Y, Cr, and Cb components to 27 MHz. Additionally, the data is linearly scaled:

$Y_{out} = a_0 * Y_{in}$ $U_{out} = a_1 * Cb_{in}$ $V_{out} = a_2 * Cr_{in}$ where $a_0, a_1, a_2$ vary depending on which signal format, such as NTSC, PAL-BDGHI, PAL-N, PAL-M, etc. is required. The data must also be frequency filtered as required by the specific format. For example, YUV data must conform to the CCIR-624 and/or RS-170A standards which define the frequency characteristics.

An improved method and apparatus for providing the interpolation, scaling, and filtering required for video format conversion is therefore desirable.

SUMMARY OF THE INVENTION

A filter in accordance with one aspect of the present invention includes a delay line, a multiplier, and a summer. The delay line has an input for receiving a time multiplexed data stream and at least one tap. The multiplier has an input for receiving samples connected to the tap and multiplies the samples by a coefficient to form weighted samples which are provided on a multiplier output. The summer has an input connected to the multiplier output and a second input. The summer adds the weighted samples with samples received on the second input to form a summer output. The time multiplexed data stream comprises a first signal and a second signal each having a series of samples. The samples of the first signal and the samples of the second signal are interlaced to form the time multiplexed data stream. The filter alternatingly operates on the samples of the first data signal and the samples of the second data signal forming a filtered time multiplexed output.

Preferred embodiments may include a multiplexer connected to the delay line input. The multiplexer has inputs for receiving the first signal and the second signal and multiplexes the first and second signals into the time multiplexed data stream. The filter may also have a demultiplexer connected to the summer output for separating the time multiplexed output into the component first and second signals. The filter may also have a coefficient multiplexer connected to an input of the multiplier. The coefficient multiplexer may alternatively provide a first or a second coefficient to the multiplier providing different responses for even and odd cycles or for the first and second first signals, or both. The filter may also have an output multiplexer for re-sequencing the filtered time multiplexed output.

A filter in accordance with another aspect of the present invention includes an input for receiving a time multiplexed data stream comprising a first signal and a second signal each having a series of samples. The samples of the first signal and the samples of the second signal are interlaced to form the time multiplexed data stream. The filter includes a delay line having an input connected to receive the data stream, an odd tap and an even tap for respectively providing odd and even delays. A first multiplier is connected to the odd tap and a second multiplier is connected to the even tap. A first summer is connected to the first multiplier and a second summer is connected to the second multiplier. A crossbar switch has a first input connected to the output of the first summer and a second input connected to the output of the second summer. The crossbar switch has a first output and a second output. The crossbar switch selectively operates to respectively connect the first and second inputs to the first and second outputs in a direct mode and alternates to a crossbar mode connecting the first and second inputs to the second and first outputs. The first multiplier and summer alternate, operating on the samples of the first data signal and the samples of the second data signal, forming a first filtered time multiplexed output. The second multiplier and summer also alternate, operating on the samples of the second data signal and the samples of the first data signal, forming a second filtered time multiplexed output. The crossbar switch alternates between the direct and crossbar modes parsing the first and second filtered time multiplexed outputs into a filtered first signal and a filtered second signal.

Preferred embodiments may include a multiplexer connected to the delay line input. The multiplexer has inputs for receiving the first signal and the second signal and multiplexes the first and second signals into the time multiplexed data stream. The filter may also have a first and a second coefficient multiplexer respectively connected to an input of the first and the second multipliers. The coefficient multiplexer may alternatively provide a first or a second coefficient to the respective multiplier allowing the filter response for the first signal to be different from the filter response for the second signal.

A two stage filter in accordance with another aspect of the present invention includes a first stage and a second stage. The first stage includes a first stage delay line, a first stage multiplier, and a first stage summer. The first stage delay line has an input for receiving a time multiplexed data stream and has a tap output. The first stage multiplier has an input connected to the tap, for multiplying the input by a first selected coefficient and forming weighted samples as a multiplier output. The first stage summer has at least one input connected to the first stage multiplier output and forms a sum as an adder output. The time multiplexed data stream includes a first input stream and a second input stream, each comprising a series of input samples which are interlaced. The first stage alternatingly operates on the input samples of the first input stream and the input samples of the second input stream, forming a filtered time multiplexed output having alternating output samples. The second stage includes a second stage delay line, an even multiplier, an odd multiplier, an even adder, and an odd adder. The second stage delay line has an input connected to receive the filtered time multiplexed output and has an odd and an even tap output for respectively providing odd and even delays. The even multiplier has an input connected to the even tap, for multiplying the input by a first coefficient and forming weighted samples as an output. The odd multiplier has an input connected to the odd tap, for multiplying the input by a second coefficient and forming weighted samples as an output. The even adder has an input connected to the even multiplier output and provides a sum as an output. The odd adder has an input connected to the odd multiplier output and provides a sum as an output. The second stage operates on the filtered time multiplexed output of the first stage and forms two second stage filtered time multiplexed outputs having alternating output samples.

A filter method in accordance with another aspect of the present invention receives a time multiplexed data stream comprising a first input stream and a second input stream. Each input stream comprises a series of input samples which are interlaced in the multiplexed data stream. A selected delay is imposed on the input forming a delayed signal. The delayed signal is multiplied by a coefficient forming weighted samples. An addition is performed using the weighted samples forming a sum as a filtered time multiplexed output having alternating output samples.

Preferred embodiments may also include receiving the first data stream as a first input and the second data stream as a second input. The input samples of the first and second data streams are interlaced to form the time multiplexed data stream. The alternating output samples may be separated into a first output data stream and a second output data stream. The coefficient may be alternated between a first value and a second value. The first value may be used for multiplying the delayed signal respective of the first data stream and the second value may be used to multiply the delayed signal respective of the second data stream. The filter method may provide a first response for the first data stream and a second response for the second data stream.

A filter method in accordance with another aspect of the present invention receives a time multiplexed data stream comprising a first input stream and a second input stream. Each input stream comprises a series of input samples which are interlaced in the multiplexed data stream. A selected odd delay and a selected even delay are imposed on the input to form an odd delayed signal and an even delayed signal. The odd delayed signal is multiplied by a first coefficient forming odd weighted samples and the even delayed signal is multiplied by a second coefficient forming even weighted samples. An addition is performed using the odd weighted samples to form odd sums as a first multiplexed output and an addition is performed using the even weighted samples to form even sums as a second multiplexed output.

Preferred embodiments may also include routing the odd sums to a first output and the even sums to a second output in a direct mode and routing the odd sums to the second output and the even sums to the first output in a crossbar mode. The odd multiplying and summing steps operate on the input samples of the first data signal during a first interval and of the second data signal during a second interval, and provide a first filtered time multiplexed output. The even multiplying and summing steps operate on the input samples of the second data signal during a first interval and of the first data stream during a second interval, and provide a second filtered time multiplexed output. The selectively routing step operates in the direct mode during the first interval and in the crossbar mode during the second interval thus parsing the first and second filtered time multiplexed outputs into a filtered first output signal and a filtered second output signal. The first data stream may be received as a first input and the second data stream may be received as a second input. The input samples of the first and second data streams are interlaced to forming the time multiplexed data stream.

DESCRIPTION OF THE PREFERRED EMBODIMENTS

Figure 1:
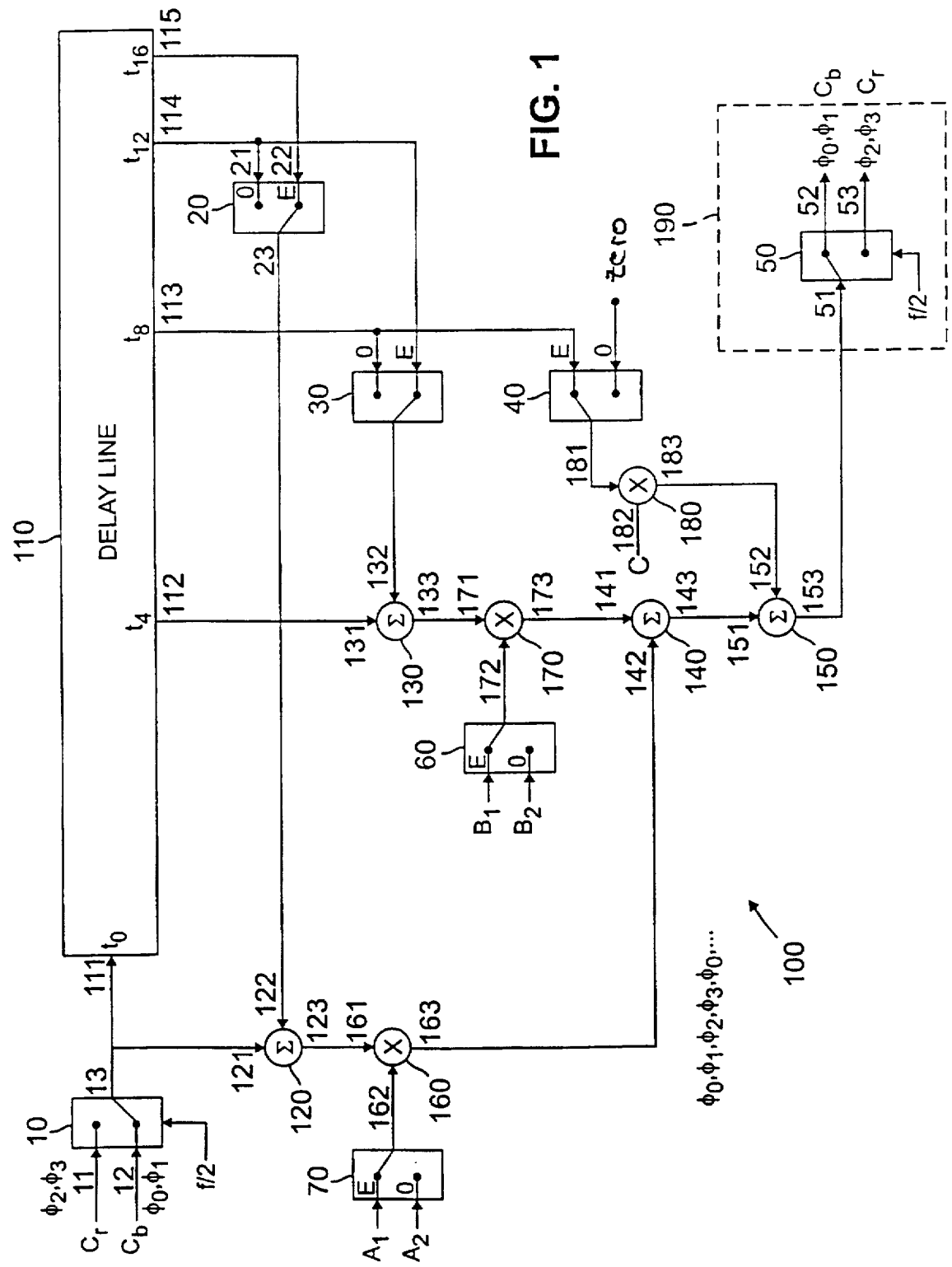
FIG. 1 is a functional block diagram of one embodiment of a time shared finite impulse response filter with a multiple signal stream capability.

Referring to FIG. 1, a time shared finite impulse response filter with a multiple signal stream capability in accordance with one aspect of the present invention will be described. Filter 100 is configured as a 1-to-2 interpolator for interpolating two color difference input signals Cr and Cb from a 6.75 MHz data rate up to a 13.5 MHz data rate for use in a video encoder. Unless otherwise noted the components of filter 100 are clocked at a frequency of 27 MHz which is twice the 13.5 MHz output data rate. The filter 100 operation will be described in terms of a four clock cycle with each clock cycle being labeled sequentially as phases 0-3, $\phi_0$, $\phi_1$, $\phi_2$, and $\phi_3$. Phases $\phi_0$ and $\phi_2$ may be called the even phases and phases $\phi_1$ and $\phi_3$ may be called the odd phases.

The two input data streams Cr and Cb are fed to filter inputs 11 and 12, respectively. A 2-to-1 multiplexer 10 clocked at half clock frequency (13.5 MHz) receives the input data streams Cr and Cb and provides a multiplexed data stream on signal line 13. Multiplexer 10 passes the Cb input 12 to output 13 during the first two phases $\phi_0$, $\phi_1$ of the cycle and passes the Cr input 11 to output 13 during the last two phases $\phi_2$, $\phi_3$. The multiplexed data stream is a sequence of alternating samples from each of the input data streams Cr and Cb. For input streams having sample sequences Cb0, Cb1, Cb2, etc. and Cr0, Cr1, Cr2, etc., the multiplexed data stream appears as Cb0, Cr0, Cb1, Cr1, Cb2, Cr2, etc. Since the multiplexer operates at half clock frequency, each sample in the multiplexed stream remains on the output 13 for two clock cycles.

The multiplexed data stream is fed to the input of delay line 110 which has several tapped delay outputs. As shown in FIG. 1, tap outputs 112, 113, 114, and 115 provide 4, 8, 12, and 16 clock delays, respectively. A sample presented to input 111 at clock cycle 0 will appear at tap 112 at clock cycle 4, at tap 113 at clock cycle 8, at tap 114 at clock cycle 12, and at tap 115 at clock cycle 16. For convenience, each position of the delay line has been labeled with a respective number e.g. $t_0$ or $t_{12}$ representative of its delay in clock cycles. Input 111 is called the $t_0$ sample, tap 112 may be called the $t_4$ sample, and taps 113, 114, and 115 may be respectively called the $t_8$, $t_{12}$, and $t_{16}$ samples. Intermediate delay line positions are numbered similarly e.g. $t_{15}$ corresponds to the 15th delay line position.

Assuming that the multiplexed input data stream contains samples Cb0, Cr0, Cb1, Cr1, Cb2, Cr2, etc. in sequence. Delay line 110 will fill with samples Cb0 at $t_{16}$ and $t_{15}$, Cr0 at $t_{14}$ and $t_{13}$, Cb1 at $t_{12}$ and $t_{11}$, Cr1 at $t_{10}$ and $t_9$, Cb2 at $t_8$ and $t_7$, Cr2 at $t_6$ and $t_5$, Cb3 at $t_4$ and $t_3$, Cr3 at $t_2$ and $t_1$, and Cb4 at $t_0$. All of the delay line tap outputs $t_0$, $t_4$, $t_8$, $t_{12}$, and $t_{16}$ are multiples of four clocks, therefore, samples from only one of the two input data streams will be present at the taps at any particular moment. Taps $t_{16}$ (115), $t_{12}$ (114), $t_8$ (113), $t_4$ (112) and input $t_0$ (111) will respectively contain Cb0, Cb1, Cb2, Cb3, and Cb4 respectively for the first two phases $\phi_0$, $\phi_1$ of each four clock cycle. During the second two phases $\phi_2$, $\phi_3$ of the four clock cycles Cr0, Cr1, Cr2, Cr3, and Cr4 will be present on taps $t_{16}$, $t_{12}$, $t_8$, $t_4$, and $t_0$, respectively.

Alternatively, the delay line may be clocked at half of the clock frequency which would require only half as many delay line positions. In the example of FIG. 1, the delay line would have 8 delay positions, each sample would occupy only one delay line position, and the tap outputs would still be $t_{16}$, $t_{12}$, $t_8$, $t_4$, and $t_0$, because the delay would be clocked at one half clock frequency. Each sample would still be held at the respective tap output for two system clocks or one delay line clock.

Multiplexers 20, 30, 40, 50, 60, and 70 provide the sample present at their respective even "E" inputs on their respective outputs during the even phases $\phi_0$ and $\phi_2$ of the four phase operating cycle. Similarly, the samples present at the respective odd "O" inputs are provided on the respective multiplexer outputs during the odd phases $\phi_1$, $\phi_3$. For example, multiplexer 70 presents the $A_1$ value on its output during the even clock cycles $\phi_0$, $\phi_2$ and the $A_2$ value during the odd clock cycles $\phi_1$, $\phi_3$.

Adders 120, 130, 140, and 150 respectively receive two input values and form a sum on an output during each clock cycle. For example, adder 120 sums the samples present on inputs 121 and 122 and provides the sum on output 123 each clock cycle. Multipliers 1160, 170, and 180 operate similarly forming the product of their respective inputs and providing the product on their respective outputs during each clock cycle.

Starting with adder 120 the overall operation of the filter 100 will be described. Adder 120 forms a sum on output 123 of the samples presented to its inputs 121 and 122 every clock cycle. Input 122 of adder 120 is fed from multiplexer 20 which provides the $t_{16}$ values during the even phases and $t_{12}$ during the odd phases to adder input 122. Samples from the input to are fed to the other input 121 of adder 120. Adder 120 therefore outputs the sum $t_0+t_{16}$ during the even clock phases $\phi_0$ and $\phi_2$, and the sum $t_0+t_{12}$ during the odd clock phases $\phi_1$ and $\phi_3$.

Multiplier 160 having an input 161 connected to the output 123 of adder 120 weights each sum produced by adder 120. A multiplexer 70 may be provided at input 162 of multiplier 160 to alternate the weighting coefficients $A_1$ and $A_2$ for each sum. Thus multiplier 160 multiplies sum $t_0+t_{16}$ by weighting coefficient $A_1$ in the even clock phases and multiplies sum $t_0+t_{12}$ by weighting coefficient $A_2$ in the odd clock phases.

Similarly, adder 130 has an input 131 connected to tap $t_4$ and an input connected to multiplexer 30 which is connected to taps $t_8$ and $t_{12}$. Adder 130 thus forms sums $t_4+t_8$ during the odd clock phases and $t_4+t_{12}$ during the even clock phases. Multiplier 170 has an input 171 connected to the output 133 of adder 130 and an input 172 connected to multiplexer 60 which provides weighting coefficients $B_1$ and $B_2$. Multiplier 170 multiplies the sum $t_4+t_{12}$ by weighting coefficient $B_1$ during the even clock phases and multiplies the sum $t_4+t_8$ by weighting coefficient $B_2$ during the odd clock phases.

Adder 140 has an input 141 connected to an output 173 of multiplier 170 and an input 142 connected to output 163 of multiplier 160. Adder 140 adds together the results of each multiplication forming the sum $A_1(t_0+t_{16})+B_1(t_4+t_{12})$ in the even clock phases and the sum $A_2(t_0+t_{12})+B_2(t_4+t_8)$ in the odd clock phases. Multiplier 180 multiplies the output of multiplexer 40 by coefficient C from input 182. Multiplexer 40 outputs $t_8$ and zero during the even and odd phases, respectively. The output of multiplier 180 is therefore the product of C and $t_8$ during the even clock phases and zero during the odd clock phases. Adder 150 has an input 151 connected to output 143 of adder 140 and an input 152 connected to output 183 of multiplier 180. Adder 150 thus provides the even sum of $A_1(t_0+t_{16})+B_1(t_4+t_{12})+C(t_8)$ during the even clock phases and the odd sum $A_2(t_0+t_{12})+B_2(t_4+t_8)$ in the odd clock phases.

In each four clock cycle, two interpolated Cr and two interpolated Cb values are generated and output by adder 150 on output 153. In clock cycle $\phi_0$ a first interpolated Cb value is calculated using the weighted sum $A_1(t_0+t_{16})+B_1(t_4+t_{12})+C(t_8)$, then in clock cycle $\phi_1$ a second interpolated Cb value is calculated using the weighted sum $A_2(t_0+t_{12})+B_2(t_4+t_8)$. Similarly, in clock cycle $\phi_2$ a first interpolated Cr value is calculated using the weighted sum $A_1(t_0+t_{16})+B_1(t_4+t_{12})+C(t_8)$, and finally in clock cycle $\phi_3$ a second interpolated Cr value is calculated using the weighted sum $A_2(t_0+t_{12})+B_2(t_4+t_8)$. Output 153 is thus time multiplexed.

A deinterleaver 190 may be provided to separate the multiplexed interpolated output samples. In FIG. 1, demultiplexer 50 has an input 51 connected to output 153 of adder 150 and two outputs, 52 and 53. Operated at one half clock frequency, demultiplexer 50 connects input 51 to output 52 during the first two clock phases and to output 53 during the second two clock phases. In this way, the multiplexed interpolated Cb and Cr output samples may be separated and steered to their respective output lines 52, 53. Alternatively, the deinterleaver 190 may be omitted in applications where subsequent stages operate on multiplexed data streams.

Figure 3:
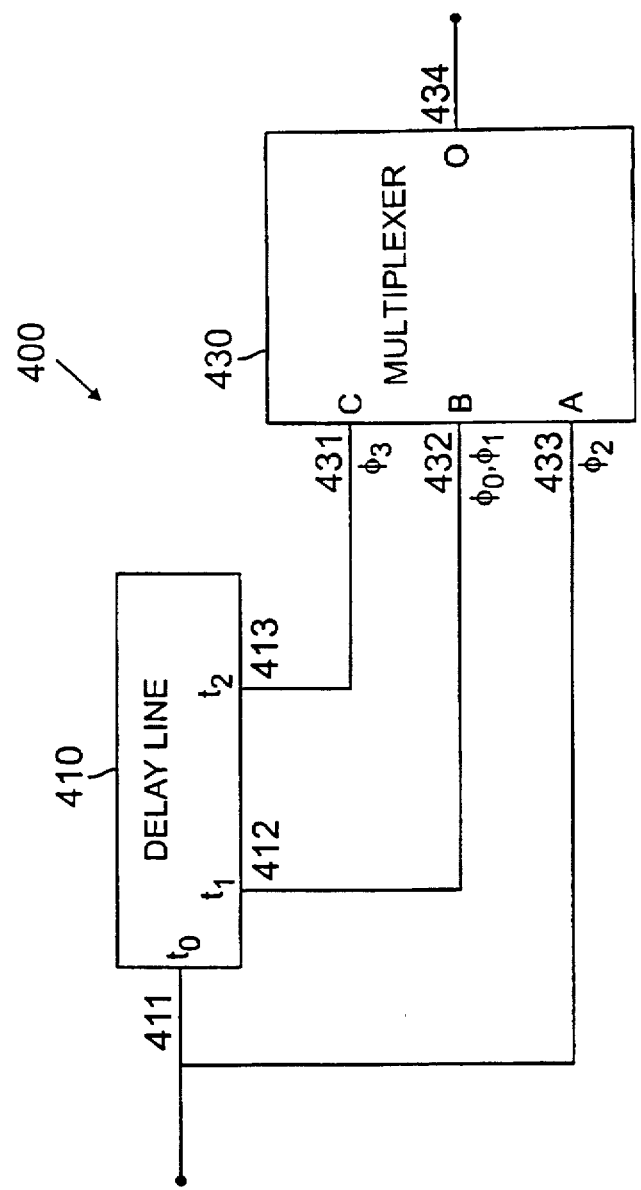
FIG. 3 is a functional block diagram of a multiplexer for cascading the filters of FIG. 1 and FIG. 2.

Alternatively, a stream multiplexer 400 as shown in FIG. 3 may be provided to create a data stream having the samples alternate every sample instead of every second sample. Referring to FIG. 3, a delay line 410 which is clocked using the 27 MHz clock has an input 411, a one clock delay tap and a two clock delay tap 412 and 413, respectively. Similar to the labeling conventions used in FIG. 1, the delay line input 411 and two taps are respectively labeled $t_0$, $t_1$, and $t_2$, respectively representing a zero, one, and two clock delay.

Multiplexer 430 has three inputs A (433), B (432), and C (431), and an output 434. Multiplexer 430 is also clocked at the 27 MHz clock rate and is synchronized to the four clock cycle of filter 100 in FIG. 1. During clock phases $\phi_0$ and $\phi_1$, multiplexer 430 provides the samples from the B input 432 on output 434. During clock phase $\phi_2$ samples from the A input 433 are provided on output 434 and the samples from the C input 431 are provided on the output during clock phase $\phi_3$.

The overall operation of stream multiplexer 400 will now be described assuming an input sample stream having a sequence of Cb0, Cb1, Cr0, Cr1, Cb2, Cb3, Cr2, etc. During the first clock phase, $\phi_0$, Cb0 is presented to input 411, yielding $t_0$=Cb0. The delay line 410 is empty, leaving $t_1$ and the output undefined. During the second clock phase, $\phi_1$, Cb1 is presented to the input 411, and Cb0 is shifted to the first tap yielding $t_0$=Cb1 and $t_1$=Cb0. Cb0 is therefore output during the second clock phase. In the third clock phase, $\phi_2$, $t_0$=Cr0, $t_1$=Cb1, and $t_2$=Cb0 and Cr0 is output. In the fourth clock phase, $\phi_3$, $t_0$=Cr1, $t_1$=Cr0, and $t_2$=Cb1. Cb1 is output during the fourth clock phase, $\phi_3$. Finally the next clock starts a new first phase $\phi_0$ during which, Cr1 shifted to the $t_1$ position and is output by the multiplexer. It will be appreciated that the stream multiplexer of FIG. 3 may be used to restore the output of filter 100 to an alternating sample stream in which adjacent samples from each data stream are interlaced with samples from the other stream.

Figure 2:
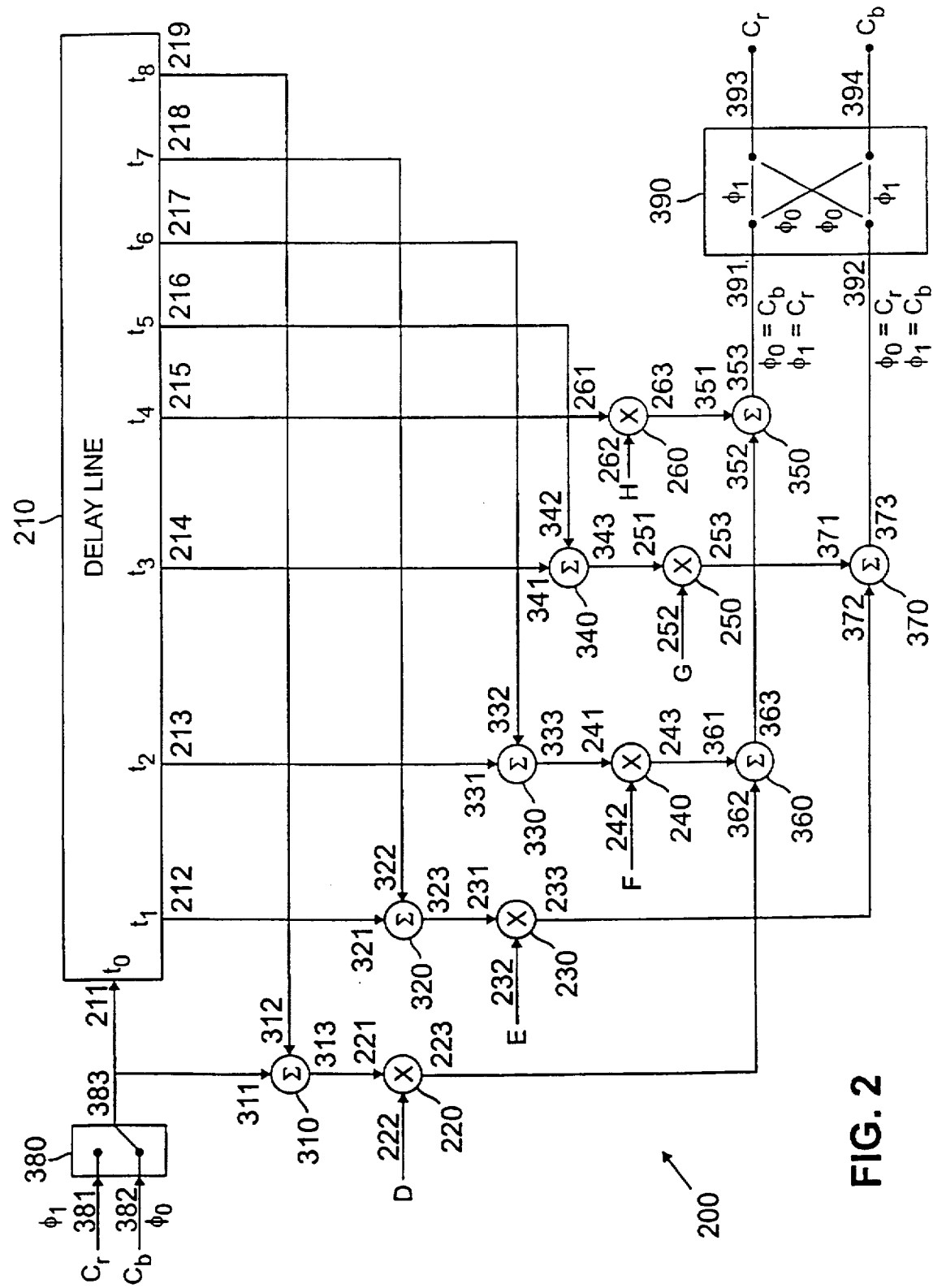
FIG. 2 is a functional block diagram of another embodiment of a time shared finite impulse response filter with a multiple signal stream capability.

Referring to FIG. 2, a second stage interpolator is used to demonstrate another aspect of the present invention. As with FIG. 1, the filter components of filter 200 are operated at a clock frequency of 27 MHz unless otherwise noted. The operation of filter 200 in FIG. 2 will be described in terms of a two clock cycle with each clock cycle being labeled phases $\phi_0$ and $\phi_1$.

Filter 200 accepts 13.5 MHz Cr and Cb data streams as inputs, performs a second stage of 1-to-2 interpolation, and provides two 27 MHz interpolated data streams as outputs. An input multiplexer 380 may be used to accept two 13.5 MHz data streams Cr and Cb on multiplexer inputs 381 and 382, respectively. During the first clock phase, $\phi_0$, Cb samples from input 382 are provided to filter input 211. Similarly, the Cr samples from input 381 are provided to input 211 during the second clock phases, $\phi_1$. A 27 MHz multiplexed data stream is provided to input 211 of filter 200 by output 383 of multiplexer 380. The multiplexed data stream includes alternating interlaced Cr and Cb samples. Alternatively, a multiplexed data stream may be provided directly to input 211 omitting multiplexer 380. In another alternative, the second stage filter 200 may be cascaded onto the output of the first stage filter 100 using the stream multiplexer 400 of FIG. 3 between the output 153 of Filter 100 and the input 211 of filter 200.

Filter input 211 is connected to the input to of delay line 210. Eight tapped delay outputs $t_1$ (212), $t_2$ (213), $t_3$ (214), $t_4$ (215), $t_5$ (216), $t_6$ (217), $t_7$ (218), and $t_8$ (219) on delay line 210 respectively provide 1, 2, 3, 4, 5, 6, 7, and 8 clock delays. Assume that the multiplexed input data stream contains samples Cb0, Cr0, Cb1, Cr1, Cb2, Cr2, etc. in sequence. Delay line 210 will then fill with samples Cb0 in $t_8$, Cr0 in $t_7$, Cb1 in $t_6$, Cr1 in $t_5$, Cb2 in $t_4$, Cr2 in $t_3$, Cb3 in $t_2$, Cr3 in $t_1$, and Cb4 in $t_0$. The even delay taps $t_0$, $t_2$, $t_4$, $t_6$, and $t_8$ will contain the Cb samples on the even clock phases $\phi_0$ and the Cr samples on the odd phases $\phi_1$. Conversely, the odd delay taps will contain the Cb samples during the odd clock phases $\phi_1$ and the Cr samples during the even clock phases $\phi_0$.

The adders 310, 320, 330, 340, 350, 360, and 370 and the multipliers 220, 230, 240, 250, and 260 operate in the same manner as described in connection with FIG. 1. Adder 310 having an input 311 connected to $t_0$ and an input 312 connected to $t_8$ forms a sum $t_0+t_8$ every clock cycle on output 313. Multiplier 220 having an input 221 connected to adder 310 and an input 222 for receiving weighting coefficient D forms the product $D(t_0+t_8)$ on its output 223. Similarly, adder 330 and multiplier 240 together form the weighted sum $F(t_2+t_6)$. Adder 360 having inputs 361 and 362 respectively connected to outputs 243 and 223 of multipliers 240 and 240 forms the sum of $D(t_0+t_8)+F(t_2+t_6)$ on its output 363. Adder 350 combines the output 363 of adder 360 with the product of $H(t_4)$ from multiplier 260 forming the sum $D(t_0+t_8)+F(t_2+t_6)+H(t_4)$ on its output 353.

Adder 320 having an input 321 connected to $t_1$ and an input 322 connected to $t_7$ forms a sum $t_1+t_7$ every clock cycle on output 323. Multiplier 230 having an input 231 connected to adder 320 and an input 232 for receiving weighting coefficient E forms the product $E(t_1+t_7)$ on its output 233. Similarly, adder 340 and multiplier 250 together form the weighted sum $G(t_3+t_5)$. Adder 370 having inputs 371 and 372 respectively connected to outputs 233 and 253 of multipliers 230 and 250 forms the sum of $E(t_1+t_7)+G(t_3+t_5)$ on its output 373.

In each two clock cycle, two interpolated Cb and two interpolated Cr values are output by filter 200. In the even clock cycles $\phi_0$, output 353 provides an interpolated Cb value according to the weighted sum $D(t_0+t_8)+F(t_2+t_6)+H(t_4)$ and output 373 provides an interpolated Cr value according to the weighted sum $E(t_1+t_7)+G(t_3+t_5)$. During the odd clock cycles $\phi_1$, output 353 provides a second interpolated Cr value according to the weighted sum $D(t_0+t_8)+F(t_2+t_6)+H(t_4)$ and output 373 provides a second interpolated Cb value according to the weighted sum $E(t_1+t_7)+G(t_3+t_5)$. Each output 353 and 373 thus provides a multiplexed data stream consisting of the interpolated and interlaced Cr and Cb values.

Crossbar switch 390 may be used to separate the multiplexed outputs into their respective components by steering output 353 to filter output 394 and output 373 to filter output 393 during the even phases $\phi_0$ and reversing during the odd phases $\phi_1$. During the odd phases, output 353 is connected to filter output 393 and output 373 is connected to filter output 394.

The filters 100 and 200 and multiplexer 400 may be synchronized by setting a clock phase counter to the starting phase, $\phi_0$ with the introduction of each data sample to the input of filter 100.

In alternative embodiments, different filter configurations may be implemented providing additional flexibility. Referring to filter 100 in FIG. 1 for example, multiplexers 60 and 70 may be omitted where the weighting coefficients are the same for the even and odd sums. Alternatively, four-to-one multiplexers may be provided at the multiplier inputs for filter implementations that provide a different response for each data stream. In such cases, the filter 100 would provide four different responses, an odd and even response for each data stream. In a non-interpolating embodiment, multiplexer 10 may be operated at the full clock frequency allowing multiplexers 60 and 70 to be used to provide different filter responses for each data stream. Similarly, four-to-one multiplexers operated at the full clock frequency may be provided at the input to delay line 110 and at the multiplier inputs to provide a four data stream filter having different responses for each data stream.

From the foregoing description it will be apparent that improvements in finite impulse response filters and methods have been provided to reduce the complexity and cost and improve the performance of the filters. While preferred embodiments have been described, it will be appreciated that variations and modifications of the herein described systems and methods, within the scope of the invention will be apparent to those of skill in the art. Accordingly, the foregoing description should be taken as illustrative and not in a limiting sense.

What is claimed is:

1. A filter comprising:
   a delay line, having an input for receiving a time multiplexed data stream and having at least one tap output;
   a multiplier, having an input connected to said tap, for multiplying said input by a coefficient and forming weighted samples as a multiplier output;
   a summer having at least two inputs, at least one of said two inputs being connected to said multiplier output, said summer adding said inputs forming a sum as an adder output;

said time multiplexed data stream comprising a first input stream and a second input stream, each said input stream comprising a series of input samples, said input samples of said first input stream and said samples of said second input stream being interlaced; and said filter alternatingly operating on said input samples of said first input stream and said input samples of said second input stream and forming a filtered time multiplexed output having alternating output samples.

2. The filter of claim 1 further comprising:

a multiplexer, having an output connected to said input of said delay line and having a first input for receiving said first input stream and a second input for receiving said second input stream, said multiplexer forming said time multiplexed data stream as an output.

3. The filter of claim 2 further comprising:

a demultiplexer, having an input connected to said adder output, said demultiplexer separating said alternating output samples of said time multiplexed output into a first output data stream and a second output data stream.

4. The filter of claim 2 further comprising:

a coefficient multiplexer connected to a second input of said multiplier, said coefficient multiplexer providing said coefficient to said multiplier during a first interval and a second coefficient to said multiplier during a second interval.

5. The filter of claim 4 wherein:

said first interval is synchronized to said input samples of said first input stream and said second interval is synchronized to said input samples of said second input stream; and said filter provides a first response for said first input stream and a second response for said second input stream.

6. The filter of claim 4 wherein:

said first interval is synchronized to even clock phases and said second interval is synchronized to odd clock phases;

said time multiplexed data stream has a first sample rate and said filtered time multiplexed output has a second sample rate;

said filter provides a first response during said even clock phases and a second response for said odd clock phases.

7. The filter of claim 2 further comprising:

a coefficient multiplexer connected to a second input of said multiplier; and wherein said time multiplexed data stream has a first sample rate and said filtered time multiplexed output has a second sample rate, said second sample rate being higher than said first sample rate;

said coefficient multiplexer providing said coefficient during a first cycle, a second coefficient during a second cycle, a third coefficient during a third cycle, and a fourth coefficient during a fourth cycle;

said filter providing a first and second response for said first input stream and a third and fourth response for said second input stream.

8. The filter of claim 1, 2, 4, 5, 6, or 7 further comprising:

an output multiplexer, having an input connected to said adder output; and wherein, said alternating output samples, alternate every sample between said first and second output data streams.

9. A filter comprising:

a delay line, having an input for receiving a time multiplexed data stream and having at least one odd tap output and at least one even tap output for respectively providing odd and even delays;

a first multiplier, having an input connected to said even tap, for multiplying said input by a first coefficient and forming weighted samples as an output;

a second multiplier, having an input connected to said odd tap, for multiplying said input by a second coefficient and forming weighted samples as an output;

a first adder having at least two inputs, at least one of said two inputs being connected to said first multiplier output, said first adder providing a sum of said inputs as an output;

a second adder having at least two inputs, at least one of said two inputs being connected to said second multiplier output, said second adder providing a sum of said inputs as an output;

said time multiplexed data stream comprising a first input stream and a second input stream, each said input stream comprising a series of input samples, said input samples of said first input stream and said samples of said second input stream being interlaced; and said filter operating on said input samples of said first data stream and said input samples of said second data stream and forming two filtered time multiplexed outputs having alternating output samples.

10. The filter of claim 9 further comprising:

a crossbar switch, having a first input connected to said output of said first adder and a second input connected to said output of said second adder and having a first output and a second output, said crossbar switch selectively connects said first input to said first output and said second input to said second output in a direct mode and connects said first input to said second output and second input to said first output in a crossbar mode;

said first multiplier and first adder operating on said input samples of said first data signal during a first interval, operating on said input samples of said second data stream during a second interval, and providing a first filtered time multiplexed output;

said second multiplier and second adder operating on said input samples of said second data signal during a first interval, operating on said input samples of said first data stream during a second interval, and providing a second filtered time multiplexed output; and said crossbar switch, operating in said direct mode during said first interval and in said crossbar mode during said second interval, parsing said first and second filtered time multiplexed outputs into a filtered first output signal and a filtered second output signal.

11. The filter of claim 10 further comprising:

a multiplexer, having an output connected to said delay line input and having a first input for receiving said first data stream and a second input for receiving said second data stream, said multiplexer forming said time multiplexed data stream as an output.

12. A filter comprising:

a first stage comprising a first stage delay line, a first stage multiplier, and a first stage summer;

said first stage delay line having an input for receiving a time multiplexed data stream and having at least one tap output;

said first stage multiplier having an input connected to said tap, for multiplying said input by a first selected coefficient and forming weighted samples as a multiplier output;

said first stage summer having at least two inputs, at least one of said two inputs being connected to said first stage multiplier output, said summer adding said inputs forming a sum as an adder output;

said time multiplexed data stream comprising a first input stream and a second input stream, each said input stream comprising a series of input samples, said input samples of said first input stream and said samples of said second input stream being interlaced;

said first stage alternatingly operating on said input samples of said first input stream and said input samples of said second input stream and forming a filtered time multiplexed output having alternating output samples;

a second stage comprising a second stage delay line, an even multiplier, an odd multiplier, an even adder, and an odd adder;

said second stage delay line, having an input connected to receive said filtered time multiplexed output and having at least one odd tap output and at least one even tap output for respectively providing odd and even delays;

said even multiplier having an input connected to said even tap for multiplying said input by a first coefficient and forming weighted samples as an output;

said odd multiplier having an input connected to said odd tap for multiplying said input by a second coefficient and forming weighted samples as an output;

said even adder having at least two inputs, at least one of said two inputs being connected to said even multiplier output, said even adder providing a sum of said inputs as an output;

said odd adder having at least two inputs, at least one of said two inputs being connected to said odd multiplier output, said odd adder providing a sum of said inputs as an output;

said second stage operating on said filtered time multiplexed output of said first stage and forming two second stage filtered time multiplexed outputs having alternating output samples.

13. A filter method comprising the steps of:
receiving a time multiplexed data stream comprising a first input stream and a second input stream, each said input stream comprising a series of input samples, said input samples of said first input stream and said samples of said second input stream being interlaced in said multiplexed data stream;

imposing a selected delay to said input samples forming a delayed signal;

multiplying said delayed signal by a coefficient forming weighted samples;

performing an addition using said weighted samples forming a sum as a filtered time multiplexed output having alternating output samples.

14. The filter method of claim 13 further comprising the step of:
receiving said first data stream as a first input and receiving said second data stream as a second input; and
interlacing said input samples of said first and said second data streams forming said time multiplexed data stream.

15. The filter of claim 14 further comprising the steps of:
separating said alternating output samples of said time multiplexed output into a first output data stream and a second output data stream.

16. The filter method of claim 14 wherein said multiplying step further comprises:

alternating said coefficient between a first value and a second value, said first value being used for multiplying said delayed signal respective of said first data stream and said second value being used to multiply said delayed signal respective of said second data stream;

said filter method providing a first response for said first data stream and a second response for said second data stream.

17. The filter method of claim 14 wherein said multiplying step further comprises:

alternating said coefficient between a first value and a second value, said first value being used for multiplications during a first phase and said second value being used for multiplications during a second phase; and said filter method providing a first response during said first phase and a second response during said second phase.

18. A filter method comprising the steps of:
receiving a time multiplexed data stream comprising a first input stream and a second input stream, each said input stream comprising a series of input samples, said input samples of said first input stream and said samples of said second input stream being interlaced in said multiplexed data stream;

imposing a selected odd delay and a selected even delay to said input forming an odd delayed signal and an even delayed signal;

multiplying said odd delayed signal by a first coefficient forming odd weighted samples;

multiplying said even delayed signal by a second coefficient forming even weighted samples;

performing an addition using said odd weighted sample forming odd sums as a first multiplexed output; and performing an addition using said even weighted samples forming even sums as a second multiplexed output.

19. The filter method of claim 18 further comprising the step of:
selectively routing said odd sums to a first output and said even sums to said second output in a direct mode and selectively routing said odd sums to said second output and said even sums to said first output in a crossbar mode; and wherein, said odd multiplying and summing steps operate on said input samples of said first data signal during a first interval, operate on said input samples of said second data stream during a second interval, and provide a first filtered time multiplexed output;

said even multiplying and summing steps operate on said input samples of said second data signal during a first interval, operate on said input samples of said first data stream during a second interval, and provide a second filtered time multiplexed output; and said selectively routing step, operating in said direct mode during said first interval and in said crossbar mode during said second interval, parses said first and second filtered time multiplexed outputs into a filtered first output signal and a filtered second output signal.

20. The filter method of claim 18 further comprising the steps of:
receiving said first data stream as a first input and receiving said second data stream as a second input; and
interlacing said input samples of said first and said second data streams forming said time multiplexed data stream.

* * * * *